United States Patent [19]

Bitsch et al.

[11] 3,939,410

[45] Feb. 17, 1976

[54] ARRANGEMENT FOR TESTING METAL-CLAD, HIGH-VOLTAGE INSTALLATIONS

[75] Inventors: Rainer Bitsch; Armin Diessner, both of Berlin, Germany

[73] Assignee: Siemens Aktiengesellschaft, Munich, Germany

[22] Filed: May 30, 1974

[21] Appl. No.: 474,652

[30] Foreign Application Priority Data

May 30, 1973 Germany............................ 2328120

[52] U.S. Cl. ..................... 324/72; 324/54; 324/133; 324/157

[51] Int. Cl.².......................................... G01R 31/02

[58] Field of Search ............... 324/54, 72, 157, 133; 317/51

[56] References Cited

UNITED STATES PATENTS

| | | | |
|---|---|---|---|
| 2,329,098 | 9/1943 | Browning | 324/54 |
| 2,333,532 | 11/1943 | Frakes et al. | 324/54 |

*Primary Examiner*—R. V. Rolinec
*Assistant Examiner*—Michael J. Tokar
*Attorney, Agent, or Firm*—Kenyon & Kenyon Reilly Carr & Chapin

[57] ABSTRACT

An arrangement for testing metal-clad, high-voltage installations includes an equipment unit having a separate encapsulation for accommodating the apparatus for making the tests. The separate encapsulation can be flanged as a unit to the installation to be tested. The arrangement is particularly suited for detecting partial discharges in metal-clad, high-voltage installations which are filled with an insulating gas, such as sulfur hexafluoride.

6 Claims, 2 Drawing Figures

ARRANGEMENT FOR TESTING METAL-CLAD, HIGH-VOLTAGE INSTALLATIONS

BACKGROUND OF THE INVENTION

The invention relates to an arrangement for testing metal-clad, high-voltage installations, particularly for detecting partial discharges, in which the metal encapsulation serves at the same time as shielding. An arrangement of this type is disclosed in Deutsche Auslegeschrift No. 1,591,853. The detection and measurement of partial discharges are important particularly in switching installations which are filled with an insulating gas, for example, sulfur hexafluoride, as this permits conclusions to be made as to the freedom from defects and the operational safety of the installation.

SUMMARY OF THE INVENTION

It is an object of the invention to facilitate the practical use of the testing apparatus in existing switching installations as well as in installations to be newly constructed, so that the tests, and particularly the partial discharge measurements, can be performed without extensive preparations.

According to the invention, the apparatus is housed in a separate enclosure, which is constructed as a unit that can be flanged to the installation to be tested. In existing installations, the equipment unit can be connected to any desired flange which has the width required for the test voltage provided. For this purpose can be considered, for instance, the connecting flange for an inductive voltage transformer, which is removed for the duration of the voltage test.

In a further embodiment of the invention, however, the metal-clad, high-voltage installation can also be equipped with a separate flange for connecting the equipment unit. The separate flange is closed off in normal operation. The labor required for performing a test is kept particularly low in this manner.

Particularly universal utility of the equipment unit can be achieved by constructing the equipment unit of individual housing elements which are provided with flanges and each contains individual circuit elements of the measuring circuit. The equipment unit can thereby be adapted very quickly to particular measurement problems.

The general applicability of the equipment unit to high-voltage installations of different kinds, such as metal-clad switching installations or pressurized-gas insulated tubular conductors, can further be enhanced by providing a transition which is provided with flanges and establishes the electrical and mechanical connection of the equipment unit with the installation to be tested. The equipment unit can further contain a grounding switch which is arranged between an element for feeding-in the voltage and a coupling element. In this way, partial discharge measurements as well as voltage tests can be performed with the equipment unit.

Although the invention is illustrated and described herein as an arrangement for testing metal-clad, high-voltage installations, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS OF THE INVENTION

Figure 1:
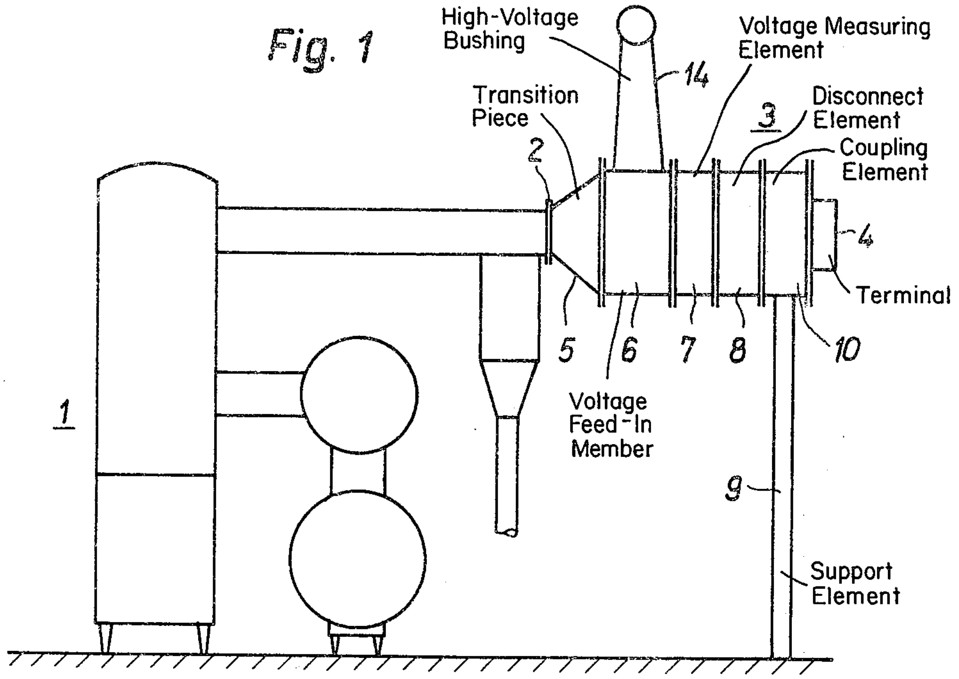
FIG. 1 is a schematic diagram illustrating the arrangement according to the invention set up for making tests on a metal-clad, high-voltage installation filled with insulating gas such as sulfur hexafluoride.

The metal-clad, high-voltage switching installation in FIG. 1 is designated with reference numeral 1 and has a flange 2 provided exclusively for connecting the equipment unit 3. Terminals 4 are on unit 3 for a measuring instrument such as an indicating or recording instrument. The equipment unit 3 is arranged in horizontal position next to the cable termination and is supported by a support element 9. The construction of the equipment unit 3 may be seen in detail in FIG. 2.

The equipment unit 3 comprises a number of individual housing elements, namely, a transition piece 5, a voltage feed-in member 6, a voltage measuring element 7, a disconnect element 8 as well as a coupling element 10 and a pickup element 11, which carries the terminal 4. All of the housing elements mentioned have flanges, so that it is possible to disassemble the equipment unit and to select another combination if required or to replace defective elements. Likewise, appropriate elements can be held in readiness for different measuring ranges or special measurement problems and inserted into the equipment arrangement. The coupling element 10 is provided with a flange cover 12 which is constructed to be gas-tight and pressure-resistant.

The transition 5 has a contact pin 13 which can be brought into conducting contact with a bus bar located in the switching installation. The voltage feed-in 6 is provided with a high-voltage bushing 14 as well as with an interchangeable filter member 15 for adapting to different ranges of partial discharge frequencies. Voltage is fed to the installation to be tested during the measurement through the high-voltage bushing 14. The voltage measuring element 7, which follows the voltage feed-in 6, contains a capacitive transformer, to which an indicating instrument 16 is connected. The disconnect element 8, which follows, contains a grounding switch 17, so that the succeeding elements can be disconnected and grounded. In the coupling element there is a coupling capacitor, whose capacity is determined in accordance with the measuring specifications. This coupling element is equipped with the flange cover 12, which thus terminates the gas space of the installation to be tested.

In the pickup unit 11 following the coupling element 10, a partial discharge pickup element 20 is located in atmospheric air. The evaluation is performed by means of a partial discharge measuring equipment 21, for which several configurations are known.

The equipment unit 3 is at the same time usable for voltage tests. For this purpose, the coupling element 10 and the circuit elements following it can be disconnected and grounded by means of the grounding switch 17. The voltage feed-in 6 and the voltage measuring element 7 remain connected to the installation.

Figure 2:
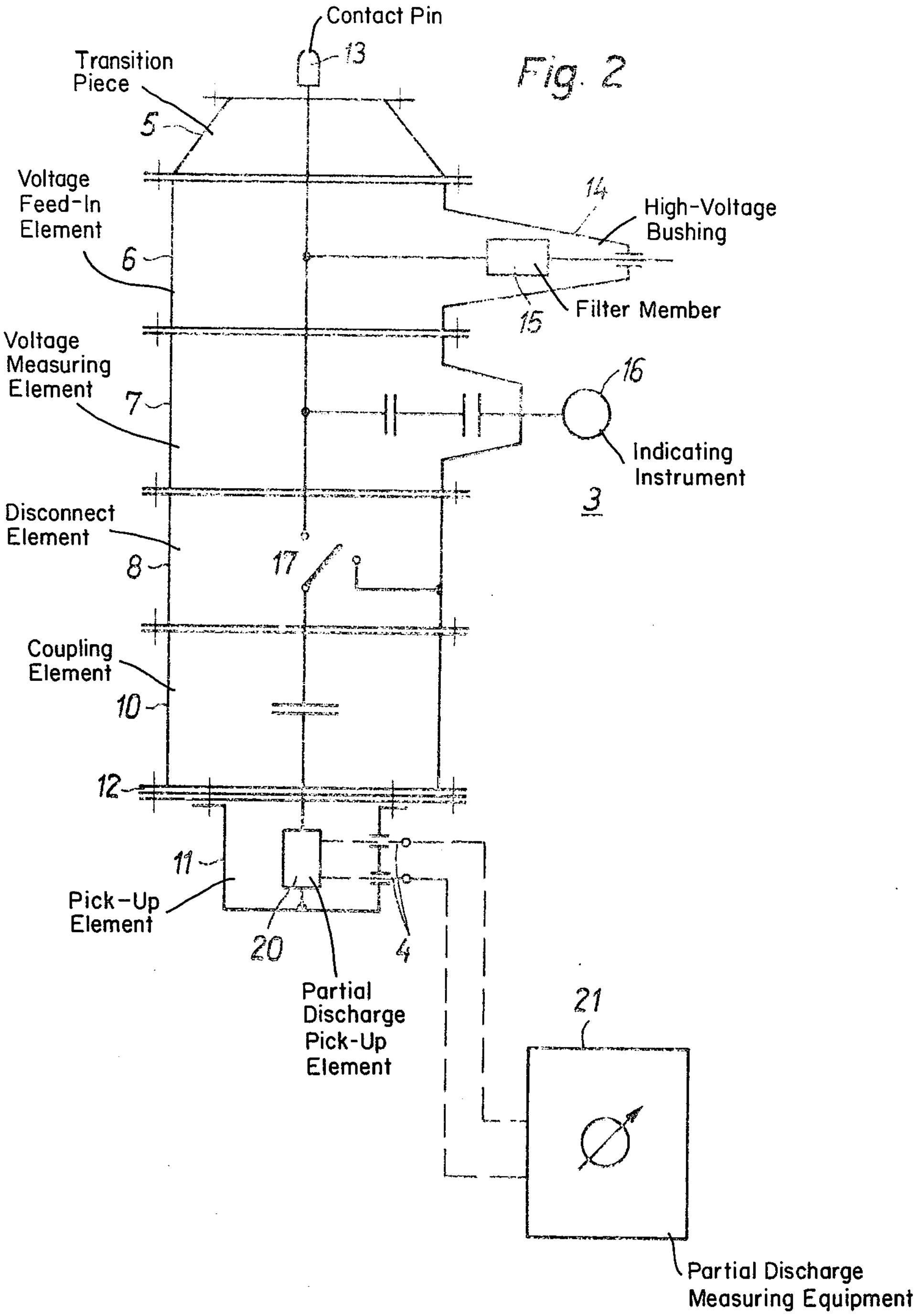
FIG. 2 is a schematic diagram showing details of the equipment unit of the arrangement according to the invention. The equipment unit is depicted schematically as being flange-connected to the high-voltage installation whereon measurements are to be performed, particularly, tests for detecting partial discharges. Tests for the dielectric strength can also be performed.

As shown in FIG. 2, the equipment unit 3 consists of largely similar units, which are equipped with the required individual elements. The equipment arrangement can therefore be disassembled and reassembled in a desired different configuration. It is thereby possible to adapt it to a multiplicity of measurement and testing problems. The connection to the installation to be tested is facilitated in every case by the transition member 5. If the equipment unit is to be used in switching installations whose connecting flange has different dimensions, it suffices to replace the transition 5 with another transition of appropriate configuration.

What is claimed is:

1. An arrangement for making tests on a metal-clad, high-voltage installation filled with insulating gas, particularly tests for detecting partial discharges, comprising a flange formed on the metal enclosure of the installation and defining an access opening in the same; an equipment unit having a metal encapsulation for accommodating the apparatus for making the tests, said metal encapsulation having a flange for removably engaging said flange of the metal enclosure of the installation; and, cover means for covering said access opening when said equipment unit is not attached to the metal enclosure of the installation.

2. The arrangement of claim 1, said equipment unit comprising a flanged transition element for electrically and mechanically connecting said equipment unit to the installation at said structure means.

3. The arrangement of claim 1, said encapsulation being made up of a plurality of individual housing elements one adjacent the other for accommodating respective components of the apparatus, each of said housing elements having respective longitudinal flanged ends for mutually connecting each two mutually adjacent ones of said housing elements.

4. An arrangement for making tests on a metal-clad, high-voltage installation filled with insulating gas, particularly tests for detecting partial discharges, comprising structure means defining an access opening formed on the metal enclosure of the installation; and, an equipment unit having a metal encapsulation for accommodating the apparatus for making the tests, said encapsulation having a flange for removably engaging said structure means of the metal enclosure of the installation and said encapsulation being made up of a plurality of individual housing elements one adjacent the other for accommodating respective components of the apparatus, each of said housing elements having respective longitudinal flanged ends for mutually connecting each two mutually adjacent ones of said housing elements, a first one of said housing elements being adjacent the metal enclosure of the installation, the component contained therein being voltage feed-in means for supplying voltage to the installation when conducting the tests thereon; a second one of said housing elements being disposed away from said first housing element, the component contained in said second housing element being coupling means for coupling an instrument to the installation for measuring the partial discharges; and a third one of said housing elements being disposed intermediate said first and second housing elements, the component contained in said third housing element being a grounding-disconnect switch for grounding said coupling means and disconnecting the same from the installation.

5. The arrangement of claim 4 comprising a fourth housing element disposed between said first housing element and said third housing element, the component contained therein being voltage measurement means for measuring the voltage in the installation during the tests thereon.

6. The arrangement of claim 5 comprising a flanged transition element for mechanically connecting said equipment unit to the installation at said structure means thereof; and, contact means contained in said transition element for connecting said voltage feed-in means to a high-voltage bus-bar contained in the installation.

* * * * *